United States Patent
Sung (10) Patent No.: US 6,451,632 B1
(45) Date of Patent: Sep. 17, 2002

(54) METHOD FOR MANUFACTURING THIN-FILM TRANSISTOR SUBSTRATE, LIQUID CRYSTAL DISPLAY UNIT

(75) Inventor: Chae Gee Sung, Miyagi-ken (JP)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/934,666

(22) Filed: Aug. 22, 2001

Related U.S. Application Data (62) Division of application No. 09/118,481, filed on Jul. 17, 1998, now Pat. No. 6,303,946.

(30) Foreign Application Priority Data

Jul. 18, 1997 (JP) .............................................. 9-194644

(51) Int. Cl.[7] .............................................. H01L 21/00
(52) U.S. Cl. ...................... 438/149; 438/151; 438/158; 438/160
(58) Field of Search ................................ 438/149, 151, 438/158, 160, 166; 257/72, 59, 347, 351; 349/43, 138, 57, 58, 59, 46

(56) References Cited

U.S. PATENT DOCUMENTS

| | | | | |
|---|---|---|---|---|
| 5,402,254 A | * | 3/1995 | Sasano et al. | 359/59 |
| 5,610,738 A | * | 3/1997 | Sasano et al. | 349/43 |
| 5,671,027 A | * | 9/1997 | Sasano et al. | 349/46 |
| 5,677,211 A | | 10/1997 | Kaneko | |
| 5,751,381 A | | 5/1998 | Ono | |
| 5,917,199 A | | 6/1999 | Byun | |
| 5,989,944 A | * | 11/1999 | Yoon | 438/149 |
| 6,278,131 B1 | * | 8/2001 | Yamazaki et al. | 257/59 |
| 6,303,946 B1 | * | 10/2001 | Sung | 257/72 |

* cited by examiner

Primary Examiner—Olik Chaudhuri
Assistant Examiner—Laura M Schillinger
(74) Attorney, Agent, or Firm—Brinks Hofer Gilson & Lione (57) ABSTRACT

The present invention provides a thin-film transistor substrate comprising: a gate electrode 40 and a gate insulating film 41 formed on a substrate 36; a semiconductor active film 42 oppositely provided on the gate electrode via the gate insulating film; a pair of ohmic contact films 43 and 44 separately provided on the semiconductor active film; a low-resistance silicon compound film 45 ranging from the ohmic contact films to the gate insulating film so as to cover the ohmic contact films and the portions of the semiconductor active film superposing with the ohmic contact films; and a source electrode 46 and a drain electrode 48 provided on the low-resistance silicon compound film.

13 Claims, 8 Drawing Sheets

METHOD FOR MANUFACTURING THIN-FILM TRANSISTOR SUBSTRATE, LIQUID CRYSTAL DISPLAY UNIT

This application is a divisional application of U.S. application Ser. No. 09/118,481 filed on Jul. 17, 1998, now U.S. Pat. No. 6,303,946 entitled "Thin-Film Transistor Substrate, Liquid Crystal Display Unit and Manufacturing Method of Thin-Film Transistor Substrate".

BACKGROUND OF THE INVENTION

1. Field of the Invention

The present invention relates to a thin-film transistor substrate, a liquid crystal display unit provided with the same and a manufacturing method of the thin-film transistor substrate. More particularly, the invention relates to a technique capable of improving transistor properties by using a special structure for the connecting portion between source and drain electrodes and a semiconductor active film.

2. Description of the Related Art

Figure 6:
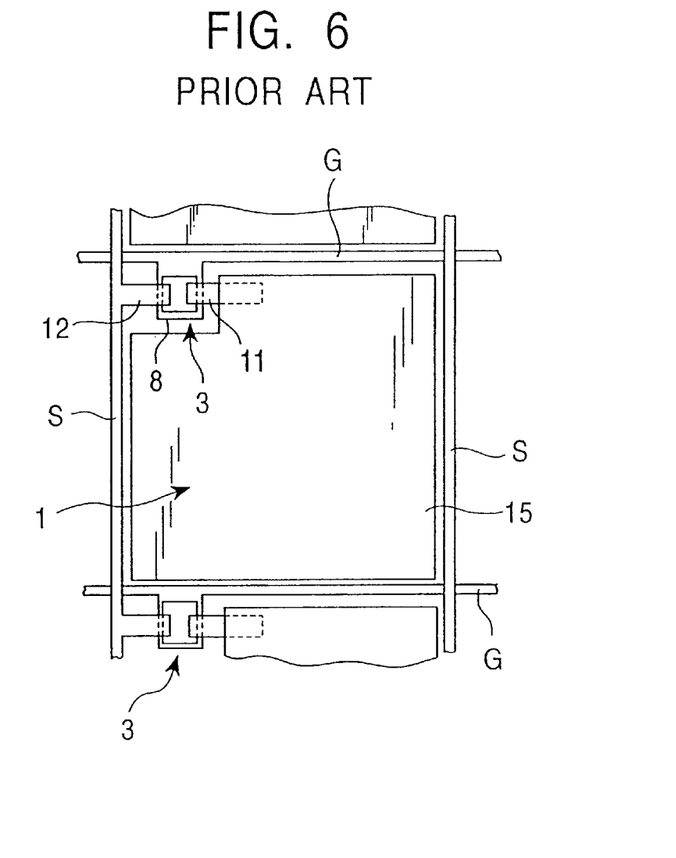
FIG. 6 is a schematic plan view of a picture element section in an example of the conventional liquid crystal display unit.
Figure 7:
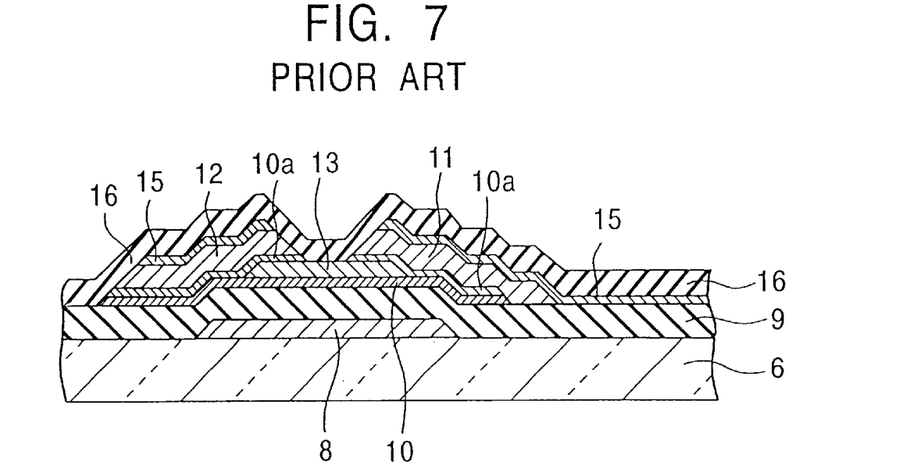
FIG. 7 is a sectional view of the liquid crystal display unit shown in FIG. 6.

FIGS. 6 and 7 illustrate a typical structure of a thin-film transistor array substrate provided with various parts such as a gate wiring G and a source wiring S on a substrate in a conventional thin-film transistor type liquid crystal display unit. In the thin-film transistor array substrate shown in FIGS. 6 and 7, the gate wiring G and the source wiring S are arranged in a matrix shape on a transparent substrate 6 such as a glass one. The region surrounded by the gate wiring G and the source wiring S serves as a picture element section 1 in which a thin-film transistor 3 is provided.

The thin-film transistor 3 shown in FIGS. 6 and 7 has a general configuration of the etch-stopper type, and comprises a gate insulating film 9 provided on a gate wiring G and an gate electrode 8 provided by extracting from the gate wiring G; a semiconductor active film 10 comprising amorphous silicon (a-Si) provided on this gate insulating film 9 oppositely to the gate electrode 8; and a drain electrode 11 and a source electrode 12 comprising a conductive material provided opposite to each other on this semiconductor active film 10. On the upper sides of the both sides of the semiconductor active film 10, there are formed ohmic contact films 10a and 10a made of amorphous silicon by doping impurities serving as donors such as phosphorus at high concentrations, and an etching stopper 13 held between the drain electrode 11 and the source electrode 12 is formed thereon. A transparent picture element electrode 15 comprising a transparent electrode material is connected so as to range from above the drain electrode 11 to a side of the drain electrode 11.

A passivation film 16 is provided so as to cover the gate insulating film 9, the transparent picture element electrode 15, the drain electrode 11 and the source electrode 12. An orientation film not shown is formed on the passivation film 16. An active matrix liquid crystal display unit is formed by providing a liquid crystal above this orientation film, so that impression of an electric field to liquid crystal molecules by means of the transparent picture element electrode 15 permits orientation control of the liquid crystal molecules.

The liquid crystal display unit of the above-mentioned construction has a configuration in which a back light is provided on the back of the transparent substrate 6, and the user can recognize bright or dark from whether the orientation-controlled liquid crystal interrupts or allows to transmit a light emitted from the back light.

However, when a part of the light entering the transparent substrate 6 should reach the semiconductor active film 10 between the drain electrode 11 and the source electrode 12, a charge is produced in the semiconductor active film 10 through excitation by the light, causing photocurrent to flow. When driving the thin-film transistor, therefore, leakage current would flow although the circuit is turned off. The flow of such leakage current causes an increase in turnoff current ($I_{OFF}$) during driving of the liquid crystal, and this may adversely affect light transmissivity of the liquid crystal.

For the purpose of avoiding this inconvenience, there is proposed a structure in which the gate electrode 8 is formed of a light shielding conductive film by forming the gate electrode 8 into a size larger than the semiconductor active film 10 so as to prevent the light of the back light from reaching the semiconductor active film 10.

Figure 8:
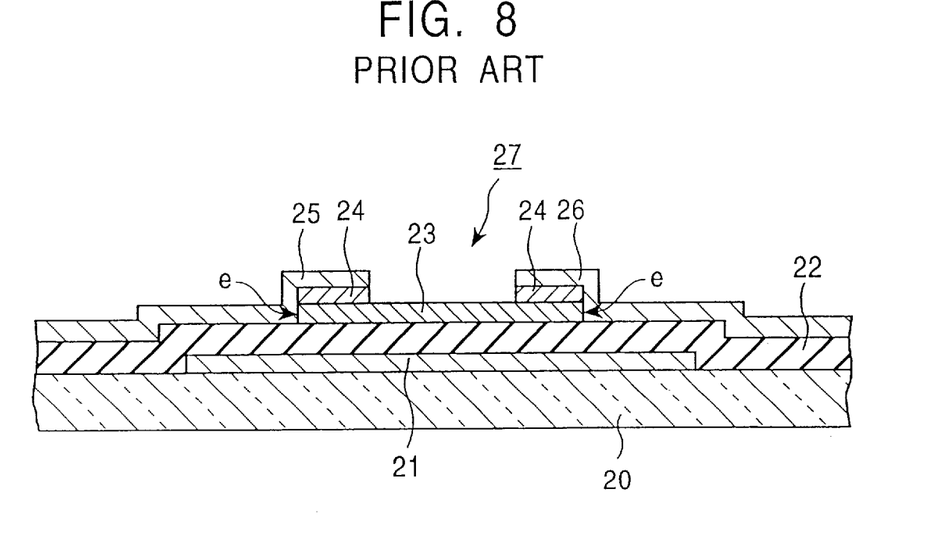
FIG. 8 is a sectional view illustrating an example of the conventional thin-film transistor.

FIG. 8 illustrates a typical thin-film transistor structure of this kind: the thin-film transistor 27 comprises a gate electrode 21 made of a light-shielding conductive material provided on a substrate 20; a gate insulating film 22 covering the gate electrode 21; a semiconductor active film 23 smaller than the gate electrode 21 provided opposite to the gate electrode 21 on the gate insulating film 22; ohmic contact films 24 and 24 provided on the both sides of the semiconductor active film 23; a source electrode 25 covering one of the ohmic contact films 24; and a drain electrode 26 covering the other ohmic contact film 24.

With the structure shown in FIG. 8, in which the gate electrode 21 serves also as a light shielding layer, it is possible to prevent the light from the back light from entering the semiconductor active film 23, and ensure satisfactory electrical contact of the source electrode 25 and the drain electrode 26 with the semiconductor active film 23 under the effect of the ohmic contact films 24 and 24.

Figure 10:
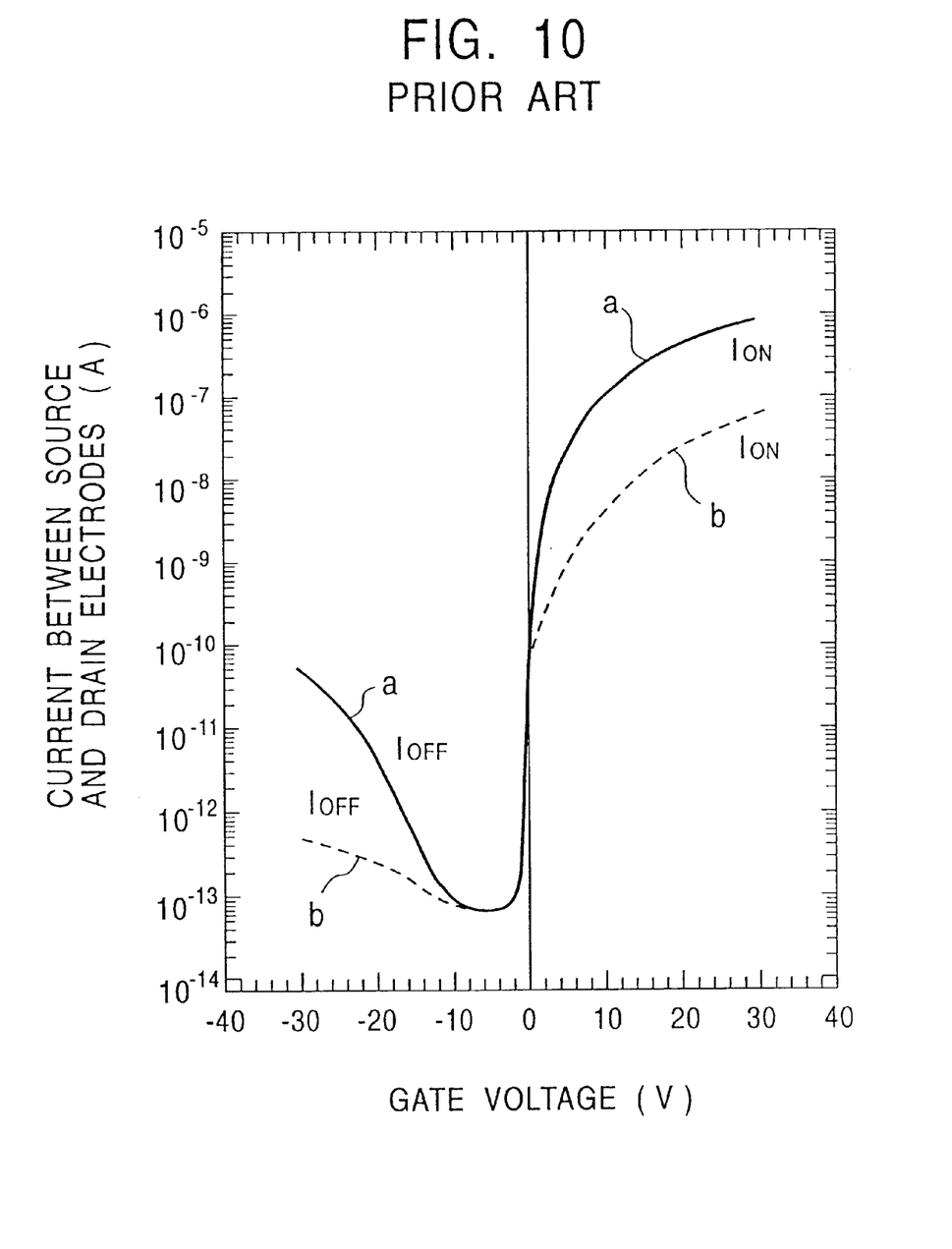
FIG. 10 is a graph illustrating characteristics of ON-current and OFF-current of the typical conventional thin-film transistors.

With the structure shown in FIG. 8, however, measurement of OFF-current ($I_{OFF}$) and ON-current ($I_{ON}$) as a thin-film transistor gives a curve as shown in FIG. 10, suggesting a problem of impossibility to achieve a sufficiently low OFF-current. As a result of search for causes carried out by the present inventors, this is attributable to the fact that, in the structure shown in FIG. 8, an end of the semiconductor active film 23 imparted a strong electric field facing the source electrode 25 is in direct contact with the source electrode 25, or an end of the semiconductor active film 23 facing the drain electrode 26 is in direct contact with the drain electrode 26, at portion e in FIG. 8, and this makes it impossible to obtain a sufficient Hall blocking effect.

Figure 9:
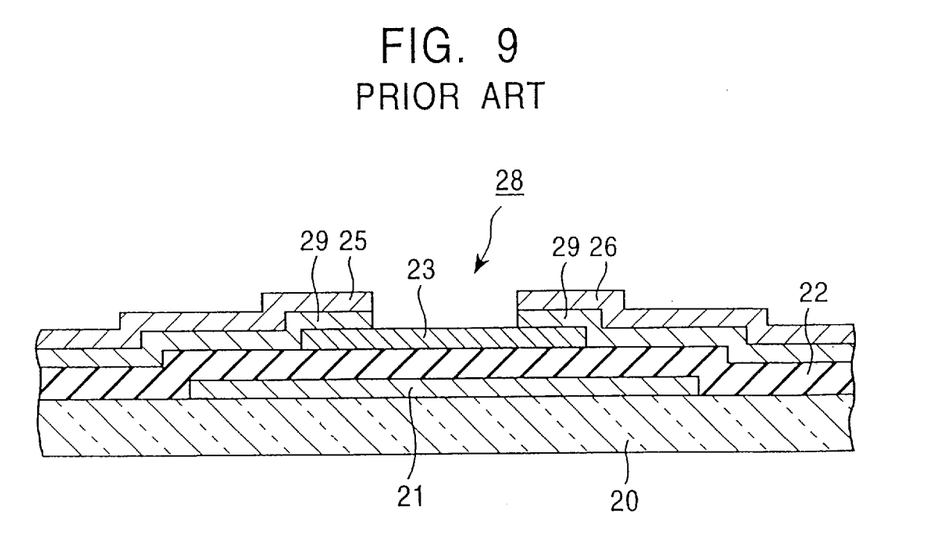
FIG. 9 is a sectional view illustrating another example of the conventional thin-film transistor.

FIG. 9 illustrates another example of conventional structure of thin-film transistor. The thin-film transistor 28 in this example comprises an ohmic contact film 29 provided so as to cover the end of the semiconductor active film 23 and the gate insulating film 22 on the side thereof, i.e., so as to be laminated over the source electrode 25 at the bottom of the source electrode 25, and another ohmic contact film 29 provided so as to be laminated over the drain electrode 26 at the bottom of the drain electrode 26.

In the structure shown in FIG. 9, however, measurement of OFF-current ($I_{OFF}$) and ON-current ($I_{ON}$) as a thin-film transistor results in a curve b as shown in FIG. 10: while the value of OFF-current can be reduced sufficiently, the value of ON-current cannot be increased.

When manufacturing the thin-film transistor 28 of the structure shown in FIG. 9, the semiconductor active film 23 is once formed on the entire upper surface of the gate insulating film 22 to form the semiconductor active film 23 on the gate insulating film 22. When patterning this film to achieve the semiconductor active film 23 having an island shape with a target size, the upper surface of the semiconductor active film 23 is susceptible to easy contamination, and even formation of the ohmic contact films 29 thereafter cannot ensure sufficient electric connection between the semiconductor active film 23 and the ohmic contact films 29. This is considered to be a cause of the above inconvenience.

SUMMARY OF THE INVENTION

The present invention was developed in view of the above-mentioned circumstances, and has an object to provide a thin-film transistor and a liquid crystal display unit provided therewith in which a source electrode and a drain electrode are connected to a semiconductor active film so as not to cause mutual contact, via a low-resistance silicon compound film, ON-current being increased by improving electric connection of these components, and OFF-current is reduced by improving electric connection between the semiconductor active film and ohmic contact films. Another object of the invention is to provide a manufacturing method of a thin-film transistor having such a structure.

To solve the above-described objects, the present invention provides a thin-film transistor substrate comprising a gate electrode provided on a substrate; a gate insulating film provided on the substrate so as to cover the gate electrode; a semiconductor active film provided oppositely via the gate insulating film above the gate electrode; a pair of ohmic contact films separately provided on the semiconductor active film; a low-resistance silicon compound film ranging from the ohmic contact film to the gate insulating film so as to cover the respective ohmic contact films and the portion of the semiconductor active film superposed on the ohmic contact films; and a source electrode and a drain electrode provided on the low-resistance silicon compound film.

By adopting the configuration as described above, the source and drain electrodes never come into direct contact in part with the semiconductor active film, and connection of the source and drain electrodes to the semiconductor active film is accomplished via the ohmic contact films and the low-resistance silicon compound film, thus permitting reduction of OFF-current.

Lamination of the ohmic contact films only on the upper surface of the semiconductor active film permits fabrication by patterning of the semiconductor active film and the ohmic contact films into a necessary shape after lamination of the both films. It is thus possible to perform sufficient electric connection between the lamination-formed semiconductor active film and the ohmic contact films and to give a sufficiently high ON-current.

To solve the above-mentioned problems, in the liquid crystal display unit of the invention, the thin-film transistor substrate serves as one of a pair of substrates having a liquid crystal layer in between.

By using such a configuration, it is possible to provide a liquid crystal display unit having a thin-film transistor having a small OFF-current and a large ON-current.

The invention provides a manufacturing method of a thin-film transistor substrate, comprising the steps of: forming a gate electrode on a substrate; forming sequentially a gate insulating film covering the gate electrode, a semiconductor film, and an impurity semiconductor film added with impurities; etch-forming the semiconductor film and the impurity semiconductor film into a semiconductor active film and an impurity semiconductor film of desired shapes above the gate electrode oppositely thereto; sequentially and continuously forming a low-resistance silicon compound film and an electrode film so as to cover the semiconductor active film, the impurity semiconductor film and the gate insulating film; and etching the impurity semiconductor film, the low-resistance silicon compound film and the electrode film, thereby forming a pair of isolated ohmic contact films, laminated low-resistance silicon compound film and source electrode ranging from the individual ohmic contact films to the gate insulating film, and laminated low-resistance silicon compound film and drain electrode.

By manufacturing a thin-film transistor by the above-mentioned method, the source and the drain electrodes are never brought into direct contact with the semiconductor active film, but are connected to the semiconductor active film via the ohmic contact films and the low-resistance silicon compound film. There is therefore available a thin-film transistor capable of reducing OFF-current.

Lamination of the ohmic contact films only on the upper surface side of the semiconductor active film permits fabrication by patterning of the semiconductor active film and the ohmic contact films into a necessary shape after lamination of the both films. It is thus possible to perform sufficient electric connection between the lamination-formed semiconductor active film and ohmic contact films and to give a sufficiently high ON-current.

The present invention also provides a manufacturing method of thin-film transistor substrate, comprising the steps of: forming a gate electrode on a substrate; forming sequentially a gate insulating film covering the gate electrode, a semiconductor film, and an impurity semiconductor film added with impurities; etch-forming the semiconductor film and the impurity semiconductor film into a semiconductor active film and an impurity semiconductor film of desired shapes above the gate electrode oppositely thereto; forming a metal film so as to cover the semiconductor active film, the impurity semiconductor film, and the gate insulating film and simultaneously forming a low-resistance silicon compound film over the portion of the metal film in contact with the semiconductor active film and the impurity semiconductor film; etch-removing the metal film to leave only the low-resistance silicon compound film; forming an electrode film so as to cover the semiconductor active film, the impurity semiconductor film, and the remaining low-resistance silicon compound film; etching the impurity semiconductor film, the low-resistance silicon compound film, and the electrode film to form a pair of isolated ohmic contact films, a source electrode and a drain electrode ranging from the individual ohmic contact films to the gate insulating film.

By continuously forming the semiconductor active film and the ohmic contact films on the gate insulating film, these films can be laminated with a cleaned interface therebetween, thus making it possible to achieve satisfactory electric connection between the both films.

Through mutual dispersion of elements in a heat treatment applied to the low-resistance silicon compound preparatory film covering the semiconductor active film and the ohmic contact films, it is possible to form a low-resistance silicon compound film covering the semiconductor active film and the ohmic contact films. By forming a source electrode and a drain electrode on this low-resistance silicon compound film, it is possible to form the source electrode and the drain electrode which are connected to the semiconductor active film via the low-resistance silicon compound film without coming into direct contact with the semiconductor active film.

BRIEF DESCRIPTION OF THE DRAWINGS

FIG. 2 illustrates a manufacturing method of the thin-film transistor shown in FIG. 1.

FIG. 4 illustrates a manufacturing method of the thin-film transistor shown in FIG. 3.

DESCRIPTION OF THE EMBODIMENTS

A few embodiments of the invention will now be described in detail. The invention is not limited in any manner by these embodiments.

Figure 1:
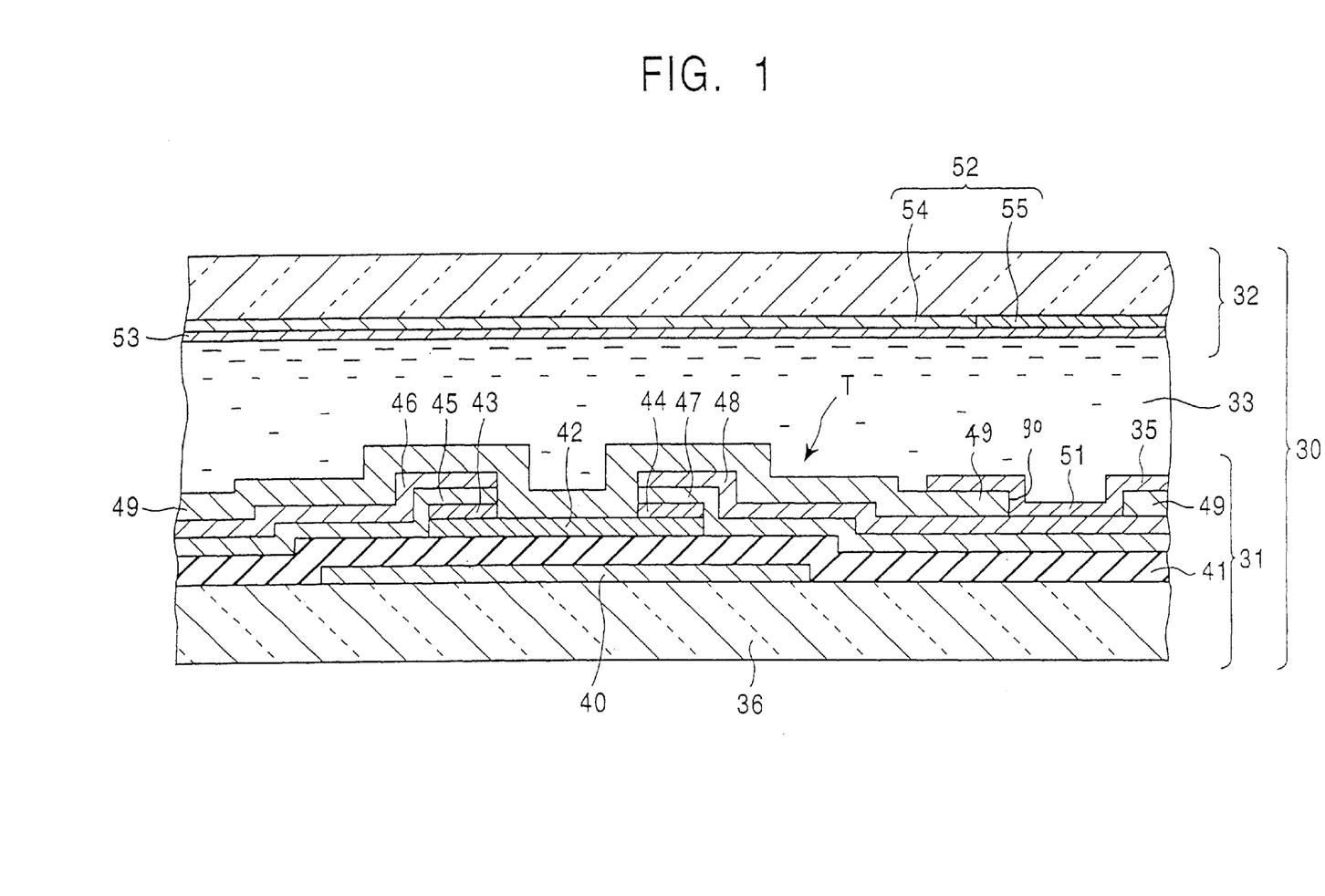
FIG. 1 is a sectional view of a liquid crystal display unit and a thin-film transistor in a first embodiment of the present invention.

FIG. 1 illustrates portions of a first embodiment of a liquid crystal display unit of the invention. The liquid crystal display unit 30 of this embodiment comprises a thin-film transistor array substrate 1, a transparent opposed substrate 32 provided separately in parallel with the thin-film transistor array substrate 31, and a liquid crystal layer 33 sealed between the thin-film transistor array substrate 31 and the opposed substrate 32.

In this thin-film transistor array substrate 31, a plurality of source wiring lines in a longitudinal rows and a plurality of gate wiring lines in a transverse rows are arranged so as to form a matrix shape as viewed flat from the upper surface side of the opposed substrate 32. A plurality of regions surrounded by the source wiring lines and the gate wiring lines are called picture element sections. A picture element electrode 35 made of a transparent conductive material such as ITO (indium-tin oxide) is formed in each of the regions corresponding to the individual picture element sections, and a thin-film transistor T is provided near each picture element electrode 35.

FIG. 1 is a sectional view illustrating, in an enlarged form, the portion of the thin-film transistor T provided in each of the regions corresponding to a picture element section surrounded by the source wiring lines and the gate wiring lines and the proximities thereof. A plurality of picture element sections are formed in rows on the thin-film transistor array substrate 31 to form a display screen of a liquid crystal display unit 30.

The thin-film transistor array substrate 31 in this form comprises a gate electrode 40 made of a light-shielding conductive material such as Cr or Mo provided on a substrate 36 in each picture element section; a gate insulating film 41 so as to cover the gate electrode 40 and the substrate 36; a semiconductor active film 42 smaller in size than the gate electrode 40 laminated on the gate insulating film 41 on the gate electrode 40; and ohmic contact films 43 and 44 laminated separately from each other with a gap on the side of the center portion of the semiconductor active film 42, aligned with the ends of the semiconductor active film 42. The gate electrode 40 is formed into a size large in width as well as in depth than the semiconductor active film 42 so as to prevent the light from a back light provided under the substrate 36 from entering the semiconductor active film 42.

Then, a low-resistance silicon compound film 45 comprising an a-Si:n$^+$ layer or chromium silicide is provided so as to cover the upper surface and the left side surface of the ohmic contact film 43 to the left in FIG. 1 (far side from the picture element electrode 35 in FIG. 1), the left side surface of the semiconductor active film 42 located thereunder, and part of the upper surface of the gate insulating film 41 continuing thereto, i.e., to cover the superposing portion of the semiconductor active film 42 and the ohmic contact film 43. Thereupon, a source electrode 46 comprising a highly conductive metal material such as Al or an Al alloy is formed. A low-resistance silicon compound film 47 comprising an n+layer or the like is formed so as to cover the upper surface and the right side surface of the ohmic contact film 43 to the right in FIG. 1 (closer side to the picture element electrode 35 in FIG. 1), the right side surface of the semiconductor active film 42 located thereunder, and part of the upper surface of the gate insulating film 41 continuing thereto, i.e., to cover the superposing portion of the semiconductor active film 42 and the ohmic contact film 43. Thereupon, a drain electrode 48 comprising a highly conductive metal material such as Al is formed.

A passivation film 49 is provided on these films so as to cover the same. A picture element electrode 35 is formed on the portion of the passivation film 49 on the right end of the drain electrode 48. This picture element electrode 35 is connected to the drain electrode 48 via a connecting conductor 51 provided in a contact hole 90 formed in the passivation film 49.

On the liquid crystal side of the opposed substrate 32 provided relative to the thin-film transistor array substrate 31, there are laminated, sequentially from the side near the opposed substrate 32, a color filter 52 and a common electrode film 53. The color filter 52 mainly comprises a black matrix 54 for covering portions not contributing to display, such as part of the thin-film transistor, part of the gate wiring and part of the source wiring, and color picture element sections 55 for allowing a light to transmit the portion of the picture element region having the picture element electrode 35 contributing to display, and also for conducting color display. These color picture element sections 55 are required for a liquid crystal display unit has a structure for color display, and provided one for each picture element section. R (red), G (green) and B (blue) color picture element sections representing three original colors are arranged regularly or at random so as to avoid deviation of colors so that adjacent picture element sections are different in color from each other.

In the sectional structure shown in FIG. 1, orientation films provided on the liquid crystal side of the thin-film transistor array substrate 31 and on the liquid crystal side of the opposed substrate 32 are omitted, and polarizing plates provided on the outside of the thin-film transistor array substrate 31 and on the outside of the opposed substrate 32.

In the structure shown in FIG. 1, the source electrode 46 and the drain electrode 48 are connected to the semiconductor active film 42 via the low-resistance silicon compound films 45 and 47, and further, via the ohmic contact films 43 and 44 on the semiconductor active film, and the source electrode 46 and the drain electrode 48 are not in direct contact with the semiconductor active film 42. Hall blocking effect is therefore certainly available. Furthermore, since there is no risk of the highly conductive metal material such as Al or an Al alloy composing the source electrode 46 and the drain electrode 48 being dispersed in the semiconductor active film, it is possible to reduce OFF-current as a thin-film transistor T.

When laminating the ohmic contact films 43 and 44 on the semiconductor active film 42, if in the structure shown in FIG. 1, it is possible to continuously form films without the need to take out the substrate from the vacuum film forming apparatus. It is therefore possible to achieve satisfactory electrical connection on the interface between the semiconductor active film 42 and the ohmic contact films 43 and 44. It is thus possible to obtain a satisfactory value of ON-current for a thin-film transistor of this embodiment.

A typical manufacturing method of the thin-film transistor T having the structure shown in FIG. 1 will now be described with reference to FIG. 2.

Figure 2A:
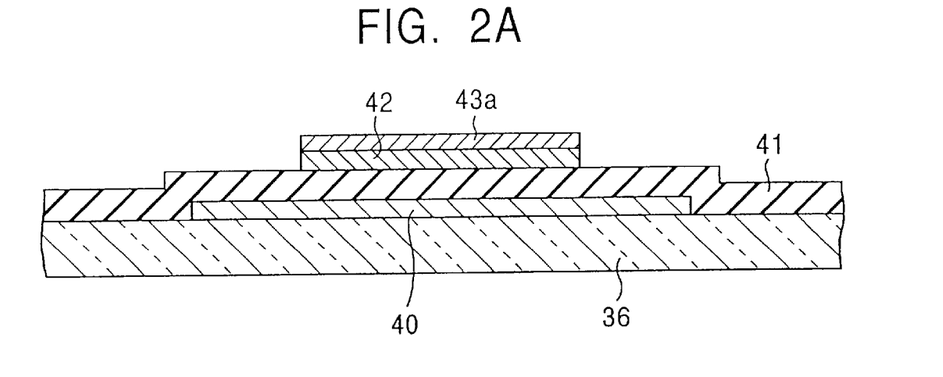
FIG. 2(A) is a sectional view illustrating a gate electrode, a gate insulating film, a semiconductor active film and ohmic contact films formed on a substrate.

The process comprises the steps of first preparing a substrate 36 shown in FIG. 2(A); forming a conductive film made of a light-shielding conductive metal material such as Cr or Mo by means of a film forming apparatus such as a sputtering unit on this substrate; then, coating thereon a resist for pattern exposure; removing unnecessary portions through etching; then, applying patterning for peeling off the resist; forming a plurality of gate wiring lines (not shown) on the substrate, and at the same time, forming a gate electrode 40 connected to the gate wiring for each position corresponding to the picture element section.

The process comprises further steps of, upon forming the gate electrode 40, forming a gate insulating film 41 of an insulating material such as $SiN_X$ so as to cover the gate wiring and the gate electrode 40 by means of a film forming apparatus; and then, continuously forming an island-shaped semiconductor active film 42 smaller in size than the gate electrode 40 and an ohmic contact film 43a at a position opposite to the gate electrode 40 at the gate insulating film 41 on the gate electrode 40. In order to form the semiconductor active film 42 and the ohmic contact film 43a, it suffices to continuously laminating films serving as materials for these films over the entire surface of the gate insulating film 41 by means of a film forming apparatus, and then, using portions remaining after removal of unnecessary portions by etching as the semiconductor active film 42 and the ohmic contact film 43a.

Figure 2B:
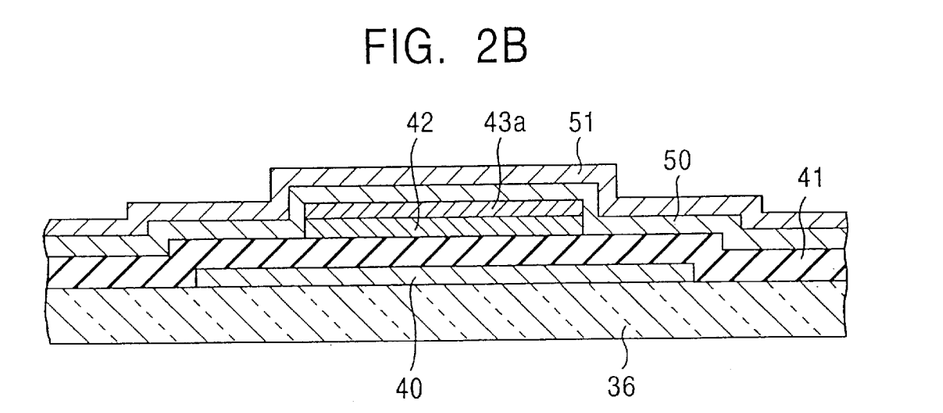
FIG. 2(B) is a sectional view illustrating a low-resistance silicon compound film and a conductive film formed on the ohmic contact films.

A low-resistance silicon compound film 50 such as an $n^+$ layer formed by adding elementary phosphorus to a semiconductor material is formed so as to cover the ohmic contact film 43a and the gate insulating film 41 as shown in FIG. 2(B), followed by formation of a conductive film 51 comprising a conductive metal material such as Al or an Al alloy on these films. If the low-resistance silicon compound film 50 and the conductive film 51 are continuously formed in a vacuum atmosphere in a film forming apparatus, the low-resistance silicon compound film 50 and the conductive film 51 can be satisfactorily connected and formed without allowing impurities to be present in the interface between these films.

Figure 2C:
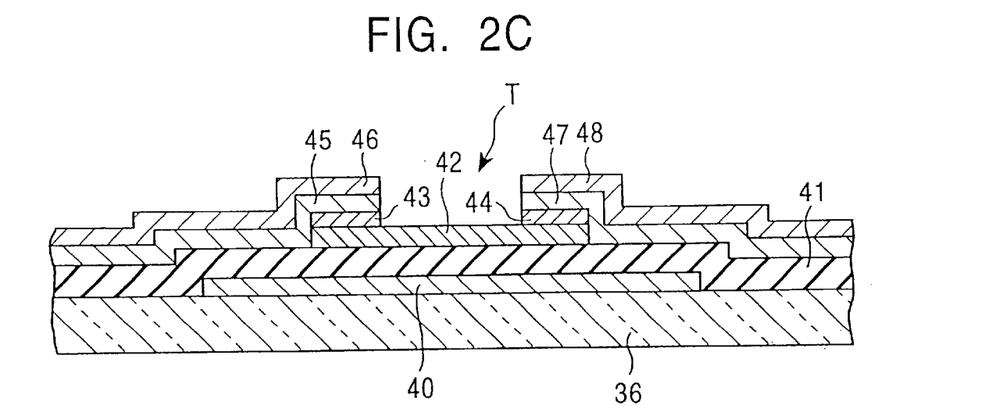
FIG. 2(C) is a sectional view of the thin-film transistor.

Then, ohmic contact films 43 and 44 are formed separately from each other on the both ends of the semiconductor active film 42 by removing by etching the upper portion of the center portion of the semiconductor active film 42, and removing portions of the ohmic contact film 43a, the low-resistance silicon compound film 50 and the conductive film 51 on the center portion of the semiconductor active film 42 as shown in FIG. 2(C). It is thus possible to form the low-resistance silicon compound films 45 and 47, the source electrode 46 and the drain electrode 48 in the covered form on the individual ohmic contact film, and also to obtain a thin-film transistor T having a structure in which the superposed portion of the semiconductor active film 42 and the ohmic contact films 43 and 44 are covered by the low-resistance silicon compound films 45 and 47, as shown in FIG. 2(C).

Although not shown in the drawing, the source wiring may be simultaneously formed upon forming the film or during etching when forming the source electrode 46 on the gate insulating film 41.

When manufacturing a thin-film transistor T by the method described above, it is possible to continuously form the semiconductor active film 42 and the ohmic contact film 43a formed thereon, and also to continuously laminate the both layers in an identical vacuum atmosphere without breaking the vacuum atmosphere in the film forming apparatus. It is thus possible to connect and form in a satisfactory state of electrical connection the semiconductor active film 42 and the ohmic contact film 43a formed thereon without causing impurities to be mixed in the connection interface between the both films. It is also possible to improve the state of electrical connection at the connection interface between the low-resistance silicon compound film 45 and the source electrode 46, and the state of electrical connection at the connection interface between the low-resistance silicon compound film 47 and the drain electrode 48. In the structure shown in FIG. 2(C), the source electrode 46 has no part in direct contact with the semiconductor active film 42, and the drain electrode 48 has no part in direct contact with the semiconductor active film 42. It is therefore possible to reduce OFF-current as a thin-film transistor T.

As a result, there is available a thin-film transistor substrate having a thin-film transistor T excellent in transistor characteristics with a high ON-current. and a low OFF-current.

Figure 3:
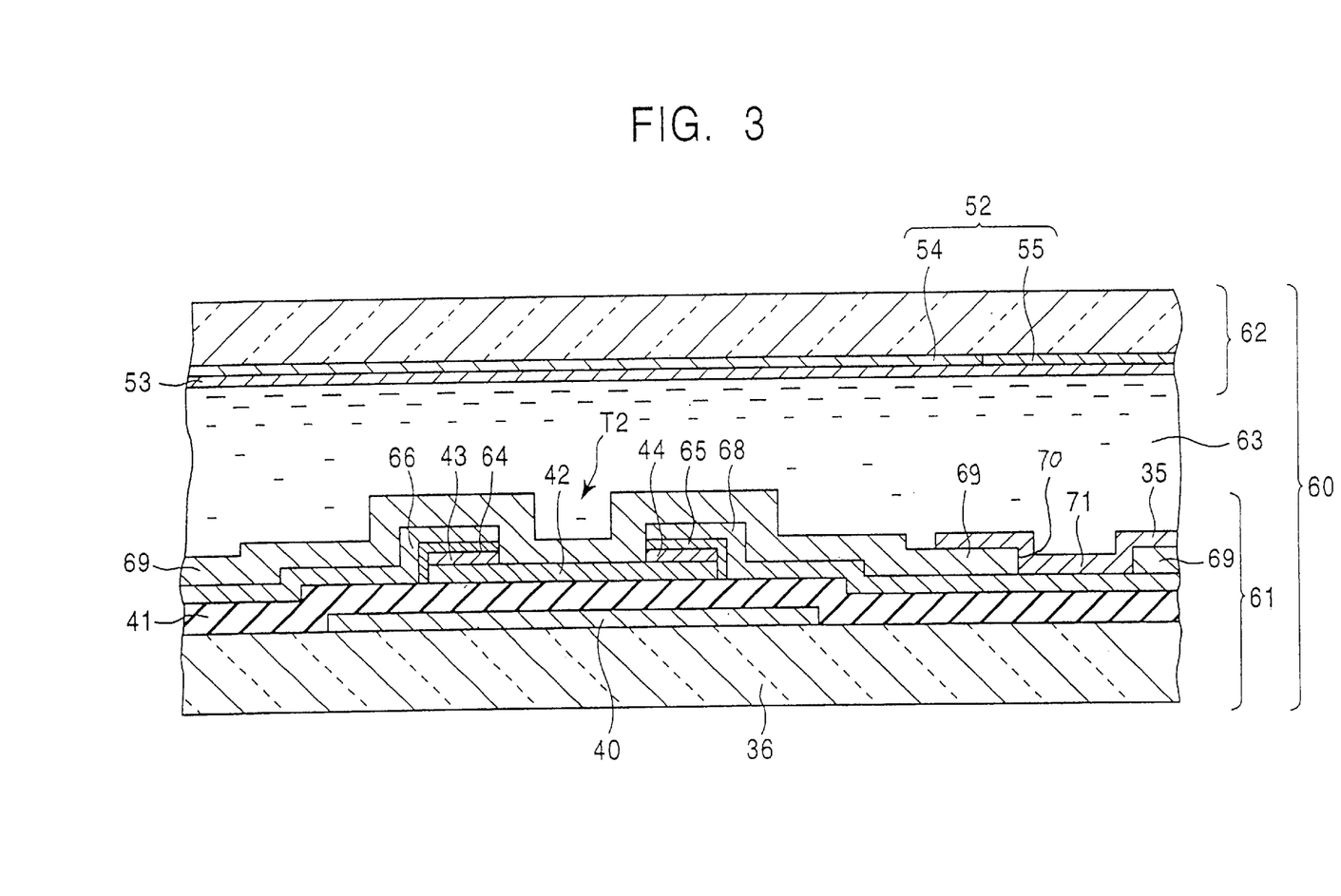
FIG. 3 is a sectional view of a liquid crystal display unit and a thin-film transistor in a second embodiment of the invention.

FIG. 3 illustrates important portions of a second embodiment of the liquid crystal display unit of the invention. The liquid crystal display unit 60 of this embodiment comprises a thin-film transistor array substrate 61f a transparent opposed substrate 62 provided in parallel with, and separately from, the thin-film transistor array substrate 61, and a liquid crystal layer 63 sealed between the thin-film transistor array substrate 61 and the opposed substrate 62.

As in the conventional structure shown in FIG. 6, a plurality of source wiring lines in the longitudinal rows and a plurality of gate wiring lines in the transverse rows are arranged in the above-mentioned thin-film transistor array substrate 61 into a matrix shape, as viewed flat from the upper surface of the opposed substrate 62. A number of regions surrounded by the source wiring lines and the gate wiring lines serve individually picture element sections. A picture element electrode 35 comprising a transparent conductive material such as ITO (indium-tin oxide) is formed in a region corresponding to each picture element section, and a thin-film transistor T2 is provided near each picture element electrode 35.

FIG. 3 illustrates, in an enlarged form, a part of the thin-film transistor T2 provided in a region corresponding to a picture element section surrounded by the source wiring lines and the gate wiring lines and the periphery thereof: a number of picture element sections are formed and arranged on the thin-film transistor array substrate 61 to form a display screen for the liquid crystal display unit 60.

The thin-film transistor array substrate 61 of this embodiment comprises a gate electrode 40 made of a light-shielding conductive material such as Cr or Mo provided on a substrate 36 in each picture element section; a gate insulating film 41 covering the gate electrode 40 and the substrate 36; a semiconductor active film 42 smaller in size than the gate electrode 40, laminated on the gate insulating film 41 on the gate electrode 40; and ohmic contact films 43 and 44 each comprising an $n^+$ layer or the like laminated separately from each other with a gap on the center portion side of the semiconductor active film 42, at a position aligned with the ends of the semiconductor active film 42. The gate electrode 40 is formed into a size larger in width and depth than the semiconductor active film 42 so as to prevent a light from a back light provided under the substrate 36 from entering the semiconductor active film 42.

There is provided a low-resistance silicon compound film 64 comprising a silicide film or the like, which covers the upper surface and the left side surface of the ohmic contact film 43 to the left in FIG. 3 (far side from the picture element electrode 35 in FIG. 3) and the left side surface of the semiconductor active film 42 provided thereunder, i.e., covers the superposed portion of the semiconductor active film 42 and the ohmic contact film 43. A source electrode 66 comprising a highly conductive metal material such as Al or an Al alloy is formed so as to cover the low-resistance silicon compound film 64, coated partially on the gate insulating film 41 adjacent thereto.

There is provided a low-resistance silicon compound film 65 comprising a silicide film or the like, which covers the upper surface and the right side surface of the ohmic contact film 44 to the right in FIG. 3 (closer side from the picture element electrode 35 in FIG. 3) and the right side surface of the semiconductor active film 42 provided thereunder, i.e., covers the superposed portion of the semiconductor active film 42 and the ohmic contact film 44. A drain electrode 68 comprising a highly conductive metal material such as Al or an Al alloy is formed thereon. The silicide film as mentioned above is formed by dispersing atoms of a metal such as Mo, Cr, W, Ta, Pt, Nb, Zr or Ni into an Si film, and among others, molybdenum silicide formed by dispersing Mo is particularly preferable.

Further, a passivation film 69 is provided on these films so as to cover these films. The picture element electrode 35 is formed on the passivation film 69 on the right end of the drain electrode 68, and is connected to the drain electrode 68 via a connecting conductor 71 provided in a contact hole 70 formed in the passivation film 69.

A color filter 52 and a common electrode film 53 are laminated sequentially from the opposed substrate 62 side on the liquid crystal side of the opposite substrate 62 provided to the thin-film array substrate 61. The color filter 52 mainly comprises a black matrix 54 for covering a portion of the thin-film transistor, a portion of the gate wiring and a portion of the source wiring not contributing to display and a color picture element section 55 for allowing transmission of a light passing through the portion contributing to display in the picture element regions provided with the picture element electrode 35, and further for performing color display. The color picture element sections 55 are required for the structure of the liquid crystal display unit for color display, and provided one for each picture element section. R (red), G (green) and B (blue) color picture element sections representing three original colors are arranged regularly or at random so as to avoid deviation of colors so that adjacent picture element sections are different in color from each other.

In the sectional structure shown in FIG. 3, orientation films provided on the liquid crystal side of the thin-film transistor array substrate 61 and on the liquid crystal side of the opposed substrate 62 are omitted, and polarizing plates provided on the outside of the thin-film transistor array substrate 61 and on the outside of the opposed substrate 62.

In the structure shown in FIG. 3, the source electrode 66 and the drain electrode 68 are connected to the semiconductor active film 42 via the low-resistance silicon compound films 64 and 65 comprising silicide films, and further, via the ohmic contact films 43 and 44 on the semiconductor active film, and the source electrode 66 and the drain electrode 68 are not in direct contact with the, semiconductor active film 42. Hall blocking effect is therefore certainly available. Furthermore, since there is no risk of the highly conductive metal material such as Al or an Al alloy composing the source electrode 66 and the drain electrode 68 being dispersed in the semiconductor active film 42, it is possible to reduce OFF-current as a thin-film transistor T2.

When laminating the ohmic contact films 43 and 44 on the semiconductor active film 42, it is possible to continuously form films without the need to take out the substrate from the film forming apparatus. It is therefore possible to achieve satisfactory electrical connection on the interface between the semiconductor active film 42 and the ohmic contact films 43 and 44. It is thus possible to obtain a satisfactory value of ON-current for the thin-film transistor T2 of this embodiment.

A typical manufacturing method of the thin-film transistor T2 having the structure shown in FIG. 3 will now be described with reference to FIG. 4.

Figure 4A:
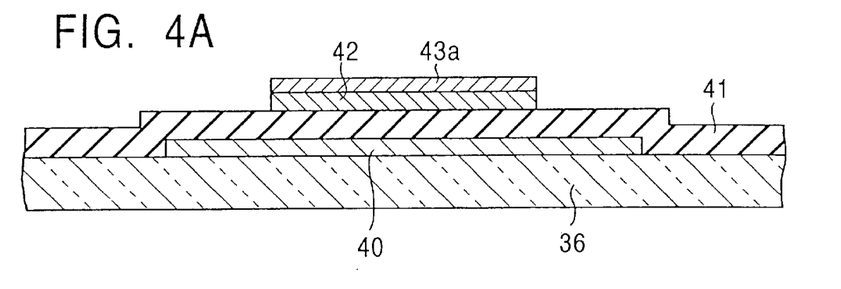
FIG. 4(A) is a sectional view illustrating a gate electrode, a gate insulating film, a semiconductor active film and ohmic contact films formed on a substrate.

The process comprises the steps of first preparing a substrate 36 shown in FIG. 4(A); forming a conductive film made of a conductive metal material such as Cr or Mo by means of a film forming apparatus such as a sputtering unit on this substrate; then, coating thereon a resist for pattern exposure; removing unnecessary portions through etching; then, applying patterning for peeling off the resist; forming a plurality of gate wiring lines (not shown), and at the same time, forming a gate electrode 40 connected to the gate wiring for each position corresponding to the picture element section. The process comprises further steps of, upon forming the gate electrode 40, forming a gate insulating film 41 of an insulating material such as $SiN_x$ so as to cover the gate wiring and the gate electrode 40 by means of a film forming apparatus; and then, continuously forming an island-shaped semiconductor active film 42 smaller in size than the gate electrode 40 and an ohmic contact film 43a at a position opposite to the gate electrode 40 at the gate insulating film 41 on the gate electrode 40. In order to form the semiconductor active film 42 and the ohmic contact film 43a, it suffices to continuously laminate films serving as materials for these films over the entire surface of the gate insulating film 41 by means of a film forming apparatus, and then, use portions remaining after removal of unnecessary portions by etching as the semiconductor active film 42 and the ohmic contact film 43a.

Figure 4B:
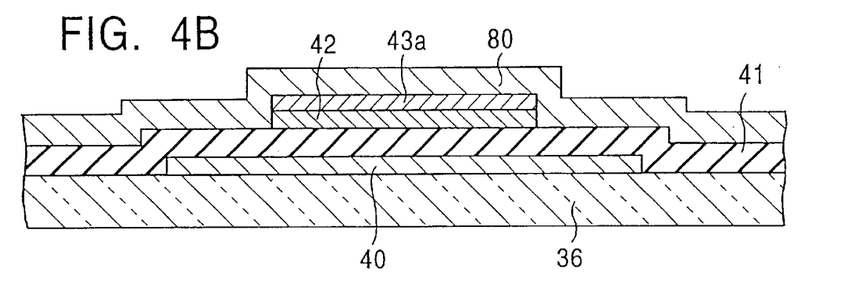
FIG. 4(B) is a sectional view illustrating a silicide preparatory thin film formed on the ohmic contact films.
Figure 4C:
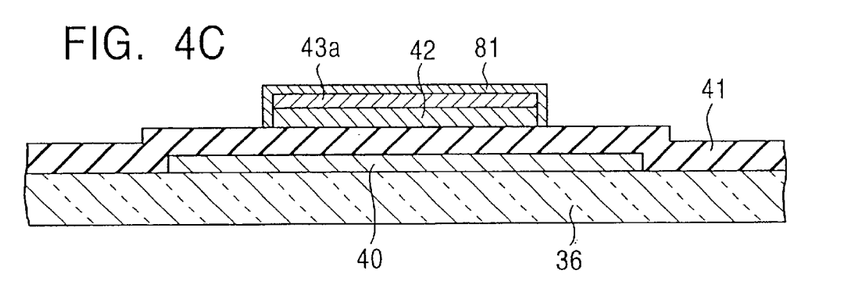
FIG. 4(C) is a sectional view illustrating a low-resistance silicon compound film formed by a heat treatment.

Then, a silicide preparatory thin film 80 comprising Mo, Ta, W, Cr. Pt, Nb, Zr or Ni is formed so as to cover the ohmic contact film 43a and the gate insulating film 41, and subjected to a heat treatment. As a result of this heat treatment, silicide films 81 are generated at portions on the both side surfaces of the semiconductor active film 42 in contact with the silicide preparatory film 80, and at the both side surface portions of the ohmic contact film 43a in contact with the silicide preparatory film 80. After the heat treatment, for example, by removing the low-resistance silicon compound preparatory film (silicide preparatory film) 80 by means for selectively removing the same by the use of an etching solution comprising a mixed solution of iodic acid, fluoric acid and acetic acid, the portion of the low-resistance silicon compound preparatory thin film 80 laminated on the gate insulating film 41 is removed, and only the portion forming the silicide film 81 remains unetched. There is thus available a silicide film 81 wrapping the ohmic contact film 43a and the semiconductor active film 42 as shown in FIG. 4(C).

Then, a conductive film comprising a conductive metal material such as Al or an Al alloy is formed on the silicide film 81 and the gate insulating film 41.

Figure 4D:
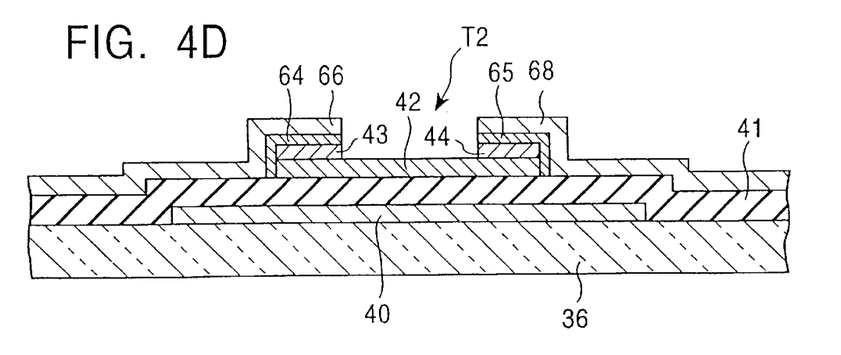
FIG. 4(D) is a sectional view of the thin-film transistor.

Then, by removing the central upper portion of the semiconductor active film 42 by the use of the lithographic technology, and removing the ohmic contact film 43a, the silicide film 81 and the conductive film on the center portion of the semiconductor active film 42 as shown in FIG. 4(D), it is possible to form ohmic contact films 43 and 44 on the both end portions of the semiconductor active film, and to form a source electrode 66 and a drain electrode 68 as coated onto the individual silicide films. There is thus available a thin-film transistor T2 of the structure shown in FIG. 4(D).

The source wiring, not shown in the drawing, may be formed simultaneously with film formation and etching when forming the source electrode 46 on the gate insulating film 41.

When manufacturing a thin-film transistor T2 by the method described above, it is possible to continuously form the semiconductor active film 42 and the ohmic contact film 43a formed thereon, and also to continuously laminate the both layers in an identical vacuum atmosphere without breaking the vacuum atmosphere in the film forming apparatus. It is thus possible to connect and form in a satisfactory state of electrical connection the semiconductor active film 42 and the ohmic contact film 43a formed thereon without causing impurities to be mixed in the connection interface between the both films. In the structure shown in FIG. 4(D), the source electrode 66 has no part in contact with the semiconductor active film 42, and the drain electrode 68 has no part in contact with the semiconductor active film 42. It is therefore possible to reduce OFF-current as a thin-film transistor T2.

As a result, there is available a thin-film transistor substrate having a thin-film transistor T2 excellent in transistor characteristics with a high ON-current and a low OFF-current.

EXAMPLES

Example 1

A rectangular gate electrode as shown in FIG. 1 having a width of 13 μm was formed with a Cr film on a transparent glass substrate, and the thus formed gate electrode was covered with an $SiN_X$ gate insulating film. A semiconductor film comprising a rectangular a-Si having a width of 9 μm was formed on the gate insulating film on the center portion of the gate electrode. On the both ends thereof, ohmic contact film having a width of 3 μm comprising phosphorus-doped $n^+$ a-Si layers were formed, respectively. Further, a low-resistance silicon compound film comprising a phosphorus (P)-doped $n^+$ a-Si layer was laminated so as to cover the ohmic contact films, and a source electrode and a drain electrode comprising Al were thereon laminated, thereby manufacturing a thin-film transistor having the sectional structure shown in FIG. 1.

Figure 5:
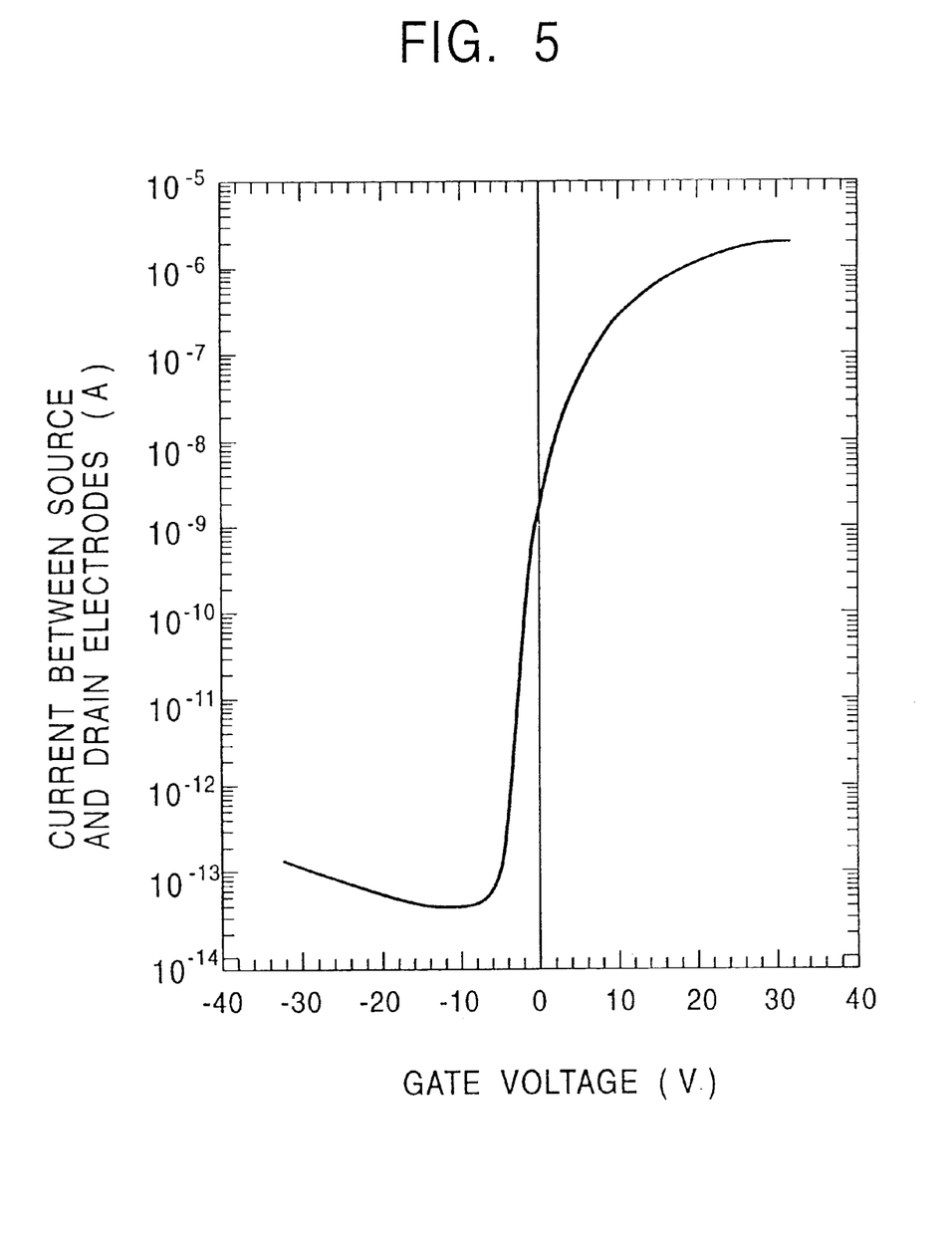
FIG. 5 is a graph illustrating properties of ON-current and OFF-current of the thin-film transistor obtained in examples.

The results of measurement of OFF-current ($I_{OFF}$) and ON-current ($I_{ON}$) of the resultant thin-film transistor are shown in FIG. 5.

Comparison of the OFF-current and the ON-current represented by the curves shown in FIG. 5 and the OFF-current and the ON-current for the conventional structure shown in FIG. 10 reveals that, by adopting the structure shown in FIG. 1, it is possible to reduce OFF-current and increase ON-current.

Example 2

A rectangular gate electrode as shown in FIG. 3 having a width of 13 μm was formed with a Cr film on a transparent glass substrate, and the thus formed gate electrode was covered with an $SiN_X$ gate insulating film. A semiconductor film comprising a rectangular a-Si having a width of 9 μm was formed on the gate insulating film on the center portion of the gate electrode. On the both ends thereof, ohmic contact films having a width of 3 μm comprising phosphorus-doped $n^+$ a-Si layers were formed, respectively. Further, a low-resistance silicon compound film comprising an Mo silicide film was formed so as to cover the upper and side surfaces of the ohmic contact films and the side surface of the semiconductor active film thereunder. A source electrode and a drain electrode comprising Al were laminated thereon, thereby manufacturing a thin-film transistor having the sectional structure as shown in FIG. 3.

The silicide film was formed by laminating the semiconductor active film and the ohmic contact films, then, forming the Mo low-resistance silicon compound preparatory thin film (silicide preparatory film) covering the same, performing elementary dispersion through a heat treatment for heating to 280° C., removing by etching the silicide film on the center portion of the semiconductor active film, and removing by etching the ohmic contact films thereunder. The results of measurement of OFF-current ($I_{OFF}$) and ON-current ($I_{ON}$) of the resultant thin-film transistor agreed with the results of Example 1 shown in FIG. 5.

Comparison of the OFF-current and the ON-current represented by the curves shown in FIG. 5 and the OFF-current and the ON-current for the conventional structure shown in FIG. 10 reveals that, by adopting the structure shown in FIG. 3, it is possible to reduce OFF-current and increase ON-current.

According to the thin-film transistor of the present invention, as described above, the material for the source electrode or the drain electrode is never brought into direct contact with the semiconductor active film, and the source electrode and the drain electrode can be connected to the semiconductor active film via the ohmic contact films and the low-resistance silicon compound film. It is thus possible to reduce OFF-current of the transistor.

By adopting the structure in which the ohmic contact films are laminated only on the side upper surfaces of the semiconductor active film, it is possible to fabricate the semiconductor active film and the ohmic contact films into necessary shapes through patterning after laminating these films continuously, and to continuously form films without breaking the vacuum atmosphere upon film formation. Impurities are therefore prevented from mixing in the interfaces between the laminated semiconductor active film and ohmic contact films, thus ensuring sufficient electrical connection of these films, and enabling to increase sufficiently ON-current.

As a result, there is provided a thin-film transistor substrate satisfying requirements of both a high ON-current and a low OFF-current so far unavailable in the conventional thin-film transistors.

The present invention further provides a liquid crystal display unit having a thin-film transistor substrate satisfying the characteristics of a high ON-current and a low OFF-current.

According to the method of the invention, furthermore, direct contact between the source and drain electrodes and the semiconductor active film can be avoided, and the source electrode and the drain electrode can be connected to the semiconductor active film via the ohmic contact films and the low-resistance silicon compound film, thus making it possible to provide a thin-film transistor capable of reducing OFF-current.

When laminating the ohmic contact films only on the upper surface of the semiconductor active film, it is possible to fabricate the semiconductor active film and the ohmic contact films by patterning into necessary shapes after laminating these films continuously, thus making it possible to provide a thin-film transistor permitting achievement of a sufficient electrical connection of the semiconductor active film and the ohmic contact films and a high ON-current.

According to the method of the invention, furthermore, continuous formation of the semiconductor active film and the ohmic contact films on the gate insulating film permits lamination of these films in a cleaned state of the interfaces between these films, thus enabling to achieve satisfactory electrical connection between these films.

What is claimed is:

1. A manufacturing method of a thin-film transistor substrate, the method comprising:

forming a light-shielding gate electrode on a transparent substrate;

forming sequentially a gate insulating film covering said gate electrode, a semiconductor film, and an ohmic film;

etching said semiconductor film and said ohmic film into a planar semiconductor active film having an area smaller than an area of the gate electrode and an ohmic contact film on an upper surface of the semiconductor active film, respectively, and shielding the entire semiconductor active film from light impinging on the semiconductor active film from a bottom of the substrate;

sequentially and continuously forming a low-resistance silicon compound film from one of a-Si:n$^+$ and a silicide, and an electrode film from one of an aluminum and an aluminum alloy, and covering both sides of said semiconductor active film, a surface and both sides of said ohmic contact film, and a surface of said gate insulating film with the low-resistance silicon compound film, and blocking diffusion of h$^+$ from the electrode film to the semiconductor active film using the low-resistance silicon compound film; and etching said ohmic contact film, said low-resistance silicon compound film, and said electrode film to form a first isolated ohmic contact film and a first laminated low-resistance silicon compound film and source electrode both ranging from the first isolated ohmic contact film to said gate insulating film, and a second isolated ohmic contact film and a second laminated low-resistance silicon compound film and drain electrode both ranging from the second isolated ohmic contact film to said gate insulating film.

2. The method of claim 1, further comprising depositing an a-Si layer in forming the semiconductor active film.

3. The method of claim 1, further comprising diffusing an element selected from the group consisting of Mo, Cr, W, Ta, Pt, Nb, Zr, and Ni, into a Si film in forming the silicide.

4. The method of claim 1, further comprising depositing one of Cr and Mo in forming the gate electrode.

5. A thin-film transistor substrate according to claim, wherein the ohmic contact film comprises n$^+$ a-Si doped with phosphorus.

6. The method of claim 1, further comprising forming the semiconductor active film from phosphorus doped a-Si.

7. The method of claim 1, further comprising securing adequate shielding of the semiconductor active film from light from the bottom of the substrate impinging thereon by limiting a width of the semiconductor active film to at most about 70% of a width of the gate electrode.

8. A manufacturing method of a thin-film transistor substrate, the method comprising:

forming a light-shielding gate electrode on a transparent substrate;

forming sequentially a gate insulating film covering said gate electrode, a semiconductor film, and an ohmic film;

etching said semiconductor film and said impurity semiconductor film into a planar semiconductor active film having an area smaller than an area of the gate electrode and an ohmic contact film on an upper surface of the semiconductor active film, respectively, and shielding the entire semiconductor active film from light impinging on the semiconductor active film from a bottom of the substrate;

forming a metal film to cover a surface and both sides of said semiconductor active film, both sides of said ohmic film, and a surface of said gate insulating film, and simultaneously forming a low-resistance silicon compound film of a silicide over a portion of the metal film in contact with said semiconductor active film and said ohmic film;

etching said metal film to leave only said low-resistance silicon compound film;

covering the low-resistance silicon compound film with an electrode film of one of aluminum and an aluminum alloy and blocking diffusion of h$^+$ from the electrode film to the semiconductor active film using the low-resistance silicon compound film;

etching said ohmic film, said low-resistance silicon compound film, and said electrode film to form a pair of isolated ohmic contact films, and a source electrode and drain electrode ranging from the individual ohmic contact films to said gate insulating film.

9. The method of claim 8, further comprising depositing an a-Si layer in forming the semiconductor active film.

10. The method of claim 8, further comprising diffusing an element selected from the group consisting of Mo, Cr, W, Ta, Pt, Nb, Zr, and Ni, into a Si film in forming the silicide.

11. The method of claim 8, further comprising depositing one of Cr and Mo in forming the gate electrode.

12. The method of claim 8, further comprising forming the semiconductor active film from phosphorus doped a-Si.

13. The method of claim 8, further comprising securing adequate shielding of the semiconductor active film from light from the bottom of the substrate impinging thereon by limiting a width of the semiconductor active film to at most about 70% of a width of the gate electrode.

* * * * *

UNITED STATES PATENT AND TRADEMARK OFFICE
CERTIFICATE OF CORRECTION

PATENT NO. : 6,451,632 B1
DATED : September 17, 2002
INVENTOR(S) : Chae Gee Sung It is certified that error appears in the above-identified patent and that said Letters Patent is hereby corrected as shown below:

<u>Column 14,</u>
Line 17, delete "claim," and substitute -- claim 1, -- in its place.

Signed and Sealed this

Thirteenth Day of May, 2003

JAMES E. ROGAN
*Director of the United States Patent and Trademark Office*